US008691063B2

(12) United States Patent
Aleksandrov (10) Patent No.: US 8,691,063 B2
(45) Date of Patent: Apr. 8, 2014

(54) METHODS AND APPARATUS FOR FORMING DIAMOND-LIKE COATINGS (75) Inventor: Sergey Aleksandrov, Kidlington (GB)

(73) Assignee: Diamond Hard Surfaces Ltd. (GB)

(*) Notice: Subject to any disclaimer, the term of this patent is extended or adjusted under 35 U.S.C. 154(b) by 828 days.

(21) Appl. No.: 12/527,375

(22) PCT Filed: Feb. 15, 2008

(86) PCT No.: PCT/GB2008/050102
§ 371 (c)(1),
(2), (4) Date: Feb. 2, 2010

(87) PCT Pub. No.: WO2008/099220
PCT Pub. Date: Aug. 21, 2008

(65) Prior Publication Data
US 2010/0178436 A1    Jul. 15, 2010

(30) Foreign Application Priority Data
Feb. 16, 2007   (GB) .................................. 0703048.9

(51) Int. Cl.
C23C 14/34 (2006.01)
(52) U.S. Cl.
USPC ............ 204/298.14; 204/298.26; 204/298.08; 204/298.07; 204/298.16; 204/298.06; 118/640; 118/715; 118/723 R
(58) Field of Classification Search
USPC ............ 204/298.26, 298.08, 298.07, 298.14, 204/298.16, 298.06; 118/620, 640, 715, 118/723 R, 723 FI, 723 E, 723 ER
See application file for complete search history.

(56) References Cited

U.S. PATENT DOCUMENTS

| 5,618,388 A * | 4/1997 | Seeser et al. ............. 204/192.12 |
| 2003/0005879 A1 | 1/2003 | Von Kanel et al. |
| 2005/0205412 A1* | 9/2005 | Rohrmann et al. ...... 204/192.12 |

FOREIGN PATENT DOCUMENTS

| EP | 0523609 | 3/1998 |
| EP | 0495447 | 5/1999 |
| JP | 2-194167 | 7/1990 |
| JP | 4-116154 | 4/1992 |
| RU | 2094528 | 10/1997 |
| RU | 2095466 | * 11/1997 |
| RU | 2105082 | 2/1998 |
| WO | WO 99/27893 | 6/1999 |
| WO | WO 03/078679 | 9/2003 |
| WO | WO 2005/054540 | 6/2005 |
| WO | WO 2005/056869 | 6/2005 |

OTHER PUBLICATIONS

Alexandrov, RU2095466—Nov. 1997, machine translation.*

(Continued)

Primary Examiner — Keith Hendricks
Assistant Examiner — Jason M Berman
(74) Attorney, Agent, or Firm — Faegre Baker Daniels LLP (57) ABSTRACT The invention is an apparatus and method for depositing a coating onto a substrate. The apparatus includes a vacuum chamber with an inlet for supplying a precursor gas to the chamber. The chamber includes a carrier for locating the substrate in the chamber, a first anode having an aperture in which plasma can be formed, and a magnetic field source. The substrate, when located in the carrier, constitutes a first cathode. When a substantially linear magnetic field between the anode and the cathode is formed, the direction of the magnetic field is substantially orthogonal to the surface to be coated and plasma production and deposition takes place substantially within the linear magnetic field.

18 Claims, 4 Drawing Sheets (56) References Cited

OTHER PUBLICATIONS

Bizyukov, A.A. et al., "Improvement of Penning Ion Sources," Problems of Atomic Science and Technology, Series: Plasma Physics, (2000), p. 153-155, vol. 5, No. 3.

Konshina, E.A. et al., "Deposition of A-C:H files in a DC glow discharge with a magnetron plasma localized near the anode," Technical Physics, (Jun. 1, 2002), p. 690-694, vol. 47, No. 6, Pleiades Publishing/AIP, Melville, NY, US.

Michler, T. et al., "DLC films deposited by bipolar pulsed DC PACVD," Diamond and Related Materials, (Feb. 1, 1998), p. 459-462, vol. 7, No. 2-5, Elsevier Science Publishers, Amsterdam, NL.

International Search Report and Written Opinion issued in PCT/GB2008/050102, mailed Jun. 24, 2009, 18 pages.

Combined Search and Examination Report issued in GB Application No. 0703048.9, dated Jun. 1, 2007, 2 pages.

English Translation of specification and claims of RU2095466, translated by professional translators at RWS Group.

* cited by examiner

METHODS AND APPARATUS FOR FORMING DIAMOND-LIKE COATINGS

CROSS-REFERENCE TO RELATED APPLICATIONS

The present application is a national phase application of PCT application PCT/GB2008/050102 filed pursuant to 35 U.S.C. §371, which claims priority to GB 0703048.9 filed Feb. 16, 2007. Both application are incorporated herein by reference in their entirety.

TECHNICAL FIELD

This invention relates to methods and apparatus for providing coatings on substrates. More specifically the invention relates to using a uniform magnetic field to obtain a coating, such as a diamond-like coating, on a substrate.

BACKGROUND

Carbon can exist in many forms which differ in their physical form and properties, including diamond/sp3 carbon. Diamond-like carbon is typically an amorphous form of sp3 carbon and has many of the same properties of diamond. Diamond-like carbon has short order chains rather than the long order chains of natural diamonds. Diamond-like coatings on substrates are used in a range of industries due to their hardness, wear resistance, high conductivity of heat, high degree of chemical inertness and low coefficient of friction.

A number of methods have been developed to deposit diamond-like coatings on a substrate, such as sputtering processes, ion beam and plasma RF deposition processes, using AC or pulsed DC voltages, using gaseous or solid carbon sources and applying sublayers to the substrate before depositing diamond-like coatings or using composite carbon coatings. Prior art methods are only capable of creating coatings up to about 5 microns without flaking. Examples of these methods can be found in WO2005/056869, WO03/078679, WO99/27893, and WO2005/054540.

RU2094528 describes a method of sputtering to obtain a diamond-like coating on a substrate. This document discloses pumping hydrocarbon into a chamber having two cathodes, an anode and the substrate, where one of the cathodes is a graphite cathode. Carbon atoms are sputtered in all directions, originating from both the hydrocarbon gas and the graphite cathode. This indirect coating method suffers from poor adhesion and deposition rates and poor deposition uniformity occurs when coating larger objects.

RU2095466 describes using an alternating magnetic field, and a hydrocarbon gas as the sole carbon source to deposit a diamond like coating directly onto the substrate. This method allows larger and circular objects to be coated and increases the deposition rate of the coating. However, due to the non-linear magnetic field a non-uniform magnetic field is created and therefore an even coating is not obtained.

RU2105082 discloses a two step method in which a sublayer is applied to the substrate before the diamond-like coating is applied, which increases the adhesion of the diamond-like coating. The document describes placing Ti cathodes between the anode and the object to be coated to sputter Ti onto the surface of the substrate. Once the sublayer is formed, the Ti cathode voltage is changed to become an anode, sputtering is stopped, and hydrocarbon gas is then introduced to form the diamond-like coating on the substrate. However the Ti electrode interferes with plasma flow during the diamond-like coating step, causing poor deposition rates and uneven coatings, especially on larger articles.

SUMMARY

The invention in one embodiments relates to a method of depositing a diamond-like coating directly onto a substrate by creating a linear magnetic field between a cathode and an anode such that the hydrocarbon plasma is in a substantially linear field. Using a uniform linear magnetic field may result in a more uniform diamond-like coating applied to the substrate, and/or allows larger objects can be coated.

In another embodiment, the invention is an apparatus for depositing a coating onto a substrate. The apparatus includes a vacuum chamber with an inlet for supplying a precursor gas to the chamber. The chamber includes a carrier for locating the substrate in the chamber, a first anode having an aperture in which plasma can be formed, and a magnetic field source. The substrate, when located in the carrier, constitutes a first cathode.

In use, a substantially linear magnetic field between the anode and the cathode is formed such that the direction of the magnetic field is substantially orthogonal to the surface to be coated and plasma production and deposition takes place substantially within the linear magnetic field. Maintaining the plasma within the magnetic field allows for better control of the plasma, and therefore provides better deposition and adhesion. Using a linear magnetic field that is orthogonal to the surface of a substrate to be coated, such that the plasma is produced from the precursor gas in the orthogonal field, provides a more even coating on the substrate. The precursor gas is selected such that it includes the ions from which the plasma will be created from. For example, a hydrocarbon gas may be used for applying a diamond-like coating while a silane gas may be used for a silicon based coating.

The anode can be various shapes depending on the substrate to be coated. In some embodiments, the anode has a non-circular aperture. A non-circular anode allows for a more even coating as it reduces the focusing of the plasma. In some embodiments, the anode can have a square or rectangular shape In some embodiments, the anode has an aperture with a depth:width aspect ratio greater than 1:2. In some embodiments, the aspect ratio is greater than 1:50. An aspect ratio of at least this dimension reduces the focusing of the plasma and thereby allows a more even coating to be obtained. The aspect ratio can be in the range of 1:2 to 1:3000 and will depend on the object that is to be coated.

In some embodiments, the apparatus includes a DC bias voltage supply such as an unpulsed DC bias voltage supply.

The magnetic field source can include a first magnet located adjacent to the cathode and a second magnet located adjacent to the anode. In some embodiments, these magnets are permanent magnets.

The magnets can be connected by a magnetic conductor such that opposite poles are presented at the cathode and anode. One of the cathode or anode will have a magnetic north polarity with the other of the cathode or anode having a south polarity. Having opposite poles for the electrodes helps create a substantially uniform magnetic field. The magnetic field can be further intensified if a soft iron type magnetic conductor is used.

In some embodiments, the substrate is able to rotate relative to the anode. The apparatus can be used to coat a wide variety of different shapes including the inner surfaces of enclosed objects and the outer surfaces of curved objects, such as pipes. In order to coat different areas of the outer surface of a substrate the apparatus may be configured so that the substrate is rotated relative to the anode to ensure that the entire outer surface to be coated comes in contact with the magnetic field and plasma and is coated.

The vacuum chamber can additionally contain a sputter ion pump for depositing a sublayer on the substrate. The sputter ion pump can include an anode and two cathodes, with at least one of the cathodes including the material to form the sublayer. In some embodiments, a titanium cathode is used. In some embodiments, magnesium, aluminium and beryllium can be used. Applying a sublayer to the substrate before applying a diamond-like coating can increase adhesion of the coating to the substrate. However, if the substrate to be coated is titanium, aluminium or magnesium a sublayer may not be used.

In some embodiments, the apparatus includes a first zone in the vacuum chamber for depositing a sublayer and a second zone for depositing the coating on the substrate. The carrier can be movable between the first and second zones. In some embodiments, having distinct areas in the chamber for performing the two processes allows separate anode and cathode arrangements to be used for each process and therefore plasma flow and control can be optimized for applying a sublayer and applying the coating.

Alternatively the vacuum chamber can additionally include an inlet to introduce a gas containing the sublayer metals. Using gases containing the sublayer materials allows for a more even sublayer to be applied. An even sublayer is important because the sublayer is not very thick and it helps to ensure that an even diamond-like coating can be formed.

In one embodiment, the anode can be located within the substrate for depositing a diamond-like coating onto an inner surface of a substrate. The inner surface of objects such as pipes can be coated using the apparatus. In some embodiments, the apparatus is configured such that the substrate can rotate relative to the anode. This can allow the entire inside cavity of an object to be coated.

In another embodiment the apparatus includes a second anode located on the opposite side of the substrate from the first cathode for depositing a coating on at least two opposite surfaces of a substrate, wherein, in use, a plasma is produced at each of the anodes. This allows two sides of an object to be coated at substantially the same time, such as two outer surfaces of an object, or an inner surface and an outer surface of the object.

In some embodiments, the apparatus can include a second cathode, such that the anode is located between the first and second cathodes and a linear magnetic field is formed between the first and second cathodes.

In another embodiment the invention is a method for depositing a coating onto a substrate in a vacuum chamber in which a substantially linear magnetic field is created between a first cathode, defined by the substrate, and a first anode having an aperture in which a plasma can be formed. The magnetic field is substantially orthogonal to the surface of the substrate. A precursor gas is supplied into the chamber and a plasma is created from the gas within the linear magnetic field at the aperture of the anode and is controlled within the magnetic field. A coating is deposited onto the substrate within the linear magnetic field. As the plasma is charged it will be directed towards the substrate surface due to the voltage difference of the anode and substrate. Controlling the plasma within a magnetic field orthogonal to the surface allows for better control of the plasma as it is deposited onto the surface of the substrate.

In some embodiments, the method includes using an anode that has a non-circular aperture. An anode that has a width: depth aspect ratio greater than 1:2, or greater than 1:50 may be used.

In some embodiments, the method includes supplying a hydrocarbon carbon gas as the precursor gas. Using a hydrocarbon gas allows a diamond-like coating to be applied to the substrate.

In some embodiments, the process is carried out at a temperature of less than 200° C. In some instances, the process is operated at a temperature of less than 140° C.

The method includes applying a DC bias voltage to create the plasma. In some embodiments, an unpulsed DC bias voltage is applied to create the plasma.

In some embodiments, the method includes depositing a sublayer on the surface of the substrate before depositing the coating onto the substrate. However if the substrate is made from a material that can be used as a sublayer, such as titanium, aluminium or magnesium, then a sublayer is not needed.

A sputter ion pump located in the chamber can be used to deposit the sublayer. Titanium, magnesium, aluminium or beryllium cathodes can be used in the sputter ion pump to form the sublayer. In some embodiments, a titanium cathode is used.

In some embodiments, the method includes depositing a sublayer in a first zone of the chamber and then depositing the coating in a second zone of the chamber. The substrate can be located on a carrier which is movable between the first and second zones.

Alternatively the sublayer is deposited by introducing a gas containing the sublayer material into the chamber, before introducing the hydrocarbon gas into the chamber. The gas forms a plasma at the anode which is accelerated towards the substrate by the electric field and is deposited directly onto the surface of the substrate.

In one embodiment, the method includes placing the first anode inside the substrate to be coated to deposit a coating onto an inner surface of the object to be coated.

In another embodiment, the method can include creating the substantially linear field between the first anode, the first cathode and a second anode for depositing a coating onto two surfaces of a substrate in a vacuum chamber wherein the cathode is located between the first and second anodes.

The method can be carried out to deposit a coating greater than 5 microns.

In some embodiments, the methods are performed using the apparatus as described above.

DETAILED DESCRIPTION

Figure 1:
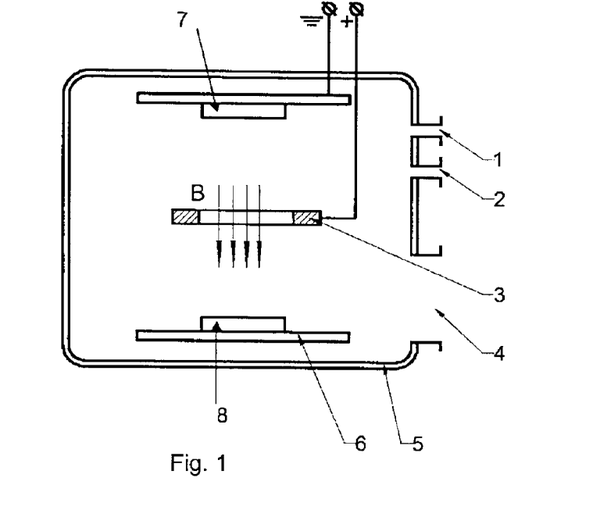
FIG. 1 shows a schematic of the apparatus for applying a coating to a substrate.

With reference to FIG. 1, a vacuum chamber 5 includes a first cathode 7 and an anode 3 for applying a diamond-like coating on a substrate 8. The substrate 8 to be coated acts as a second cathode and is located on a carrier 6. In the illustrated embodiment, both the first cathode 7 and the substrate 8 carry permanent magnets such that one has a north polarity and the other has a south polarity to produce a uniform linear magnetic field B between the first cathode 7 and the substrate 8. The cathode 7 and substrate 8 are at ground potential while the anode 3 has a positive potential. The chamber further includes an inlet for an etching gas 1, an inlet for hydrocarbon gas 2, and a port for evacuation of the vacuum chamber 4.

A diamond-like coating is deposited on the substrate by first evacuating the chamber via the port 4. A helium leak detector can be used to ensure that a good vacuum is obtained. An inert etching gas is introduced into the chamber via the inlet for an etching gas 1. In some embodiments, krypton is used as the etching gas. In other embodiments, neon and argon can be used. Once etching is complete, supply of the inert gas is stopped and the hydrocarbon gas is introduced into the chamber via the inlet for hydrocarbon gas 2. A hydrocarbon plasma is formed in the aperture of the anode 3, using a DC bias voltage that is not pulsed, and carbon atoms are directly deposited onto the surface of the substrate 8.

As the substrate 8 lies between the magnets and has the opposite polarity of the first cathode 7 a uniform magnetic field B is created which runs through the substrate 8 in a very linear uniform fashion controlling the plasma ions in the linear field as they are directed towards the substrate from the anode allowing for an even coating to be obtained on the substrate. In some embodiments, the magnetic field is in the range of about 10-200 mT, and the hydrocarbon plasma deposition occurs using a voltage in the range of about 0.5-4.5 KV. This higher voltage helps makes the plasma more stable. The strength of the magnetic field and voltage will depend upon factors such as anode size, field strength, pressures and hydrocarbon. The plasma is formed in the linear magnetic field between the anode and the substrate.

Therefore the plasma is maintained in a linear magnetic field between the point of production and deposition. Producing the plasma ions in a linear magnetic field allows better control over the deposition of the atoms and improved uniformity of the coating on the substrate.

In some embodiments, permanent magnets are used when coating a flat surface, as they create a straight linear field. It is easier to make a field that is orthogonal to the substrate with permanent magnets than with electromagnets. The permanent magnets are located behind the cathodes. The use of opposite polarities for the cathode 7 and substrate 8, as well as creating a uniform magnetic field, increases the plasma flow and therefore the deposition rate. It was expected that a more turbulent magnetic field, such as that created by alternating the polarity of the cathodes, would be better for increasing plasma deposition rates, due to more focal points for collisions of atoms causing them dissociate.

The aspect ratio of the aperture of the anode is greater than 1:2 (aperture depth:width). In some embodiments, the aspect ratio is greater than 1:50. An aspect ratio of 1:3000 can be used and the aspect ratio used can depend on the size of the object being coated. This is quite different from that used in similar arrangements such as Penning cells/ion pumps, which generally use an anode with an aperture having depth:width aspect ratio of around 1:1 to 1:2. The larger aspect ratio reduces the focusing of the plasma on the substrate, which allows for a more even coating to be obtained. In some embodiments, the anode aperture is non-circular and may have a square or rectangular shape.

In some embodiments, a second anode may be placed on the opposite side of the substrate from where the first anode is situated. This can allow both sides of a substrate to be coated.

Figure 2:
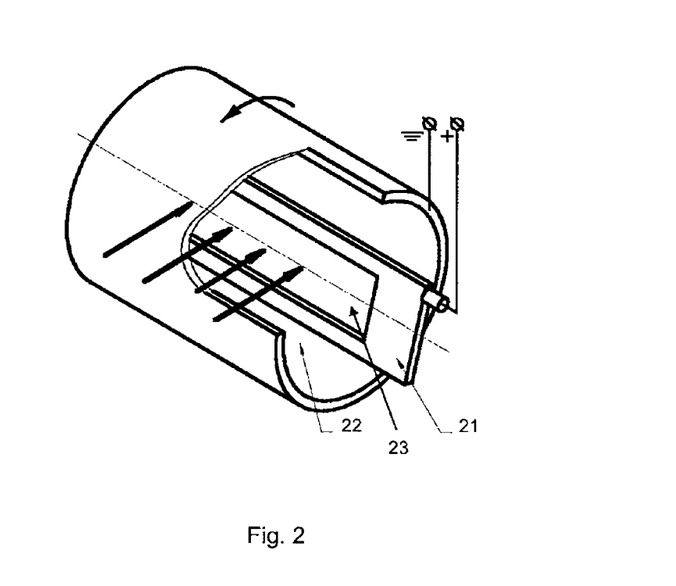
FIG. 2 shows a schematic view of part of the apparatus of the invention for applying a coating to the inner surface of objects.

FIG. 2 shows an embodiment of an apparatus for coating the inside cavity of objects. Inside a vacuum chamber, an anode 21 is located inside the substrate having an inner surface 22 to be coated. Magnets are situated outside the substrate and a magnetic circuit produces a uniform magnetic field whose direction is substantially orthogonal to the surface to be coated. The substrate acts as a cathode and is rotated relative to the anode 21. The diamond-like coating is produced as described above by introducing hydrocarbon gas into the chamber. A hydrocarbon plasma is formed at the aperture 23 of the anode and a uniform magnetic field B controls it towards the inner surface 22 of the substrate, while the substrate is rotated relative to the anode to form a coating on the inner surface 22.

Figure 3:
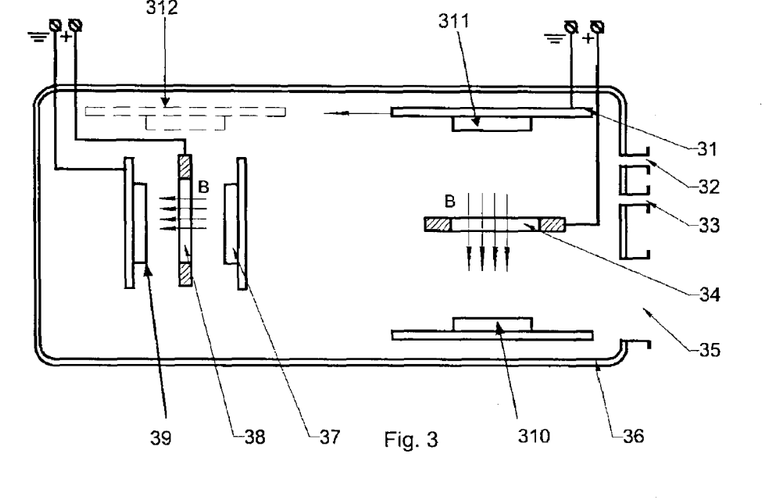
FIG. 3 shows a schematic view of an apparatus for applying a sublayer and coating to the substrate.

FIG. 3 shows an embodiment of an apparatus that is configured to apply a sublayer to the substrate before a diamond-like coating is applied. A vacuum chamber 36 includes a sputter ion pump for sputtering sublayer metal ions onto the surface of the substrate. The sputter ion pump includes two cathodes 37, 39 and a first anode 38, one of the cathode being the metal which the sublayer is to be made from. In some embodiments, the cathode is titanium, however it may also be magnesium or aluminium.

A magnetic field B is formed between the cathodes. The substrate 311 to be coated is located on a carrier 31 and is initially positioned in a first zone 312 of the chamber parallel to the magnetic field B. A plasma is created from a gas at the first anode 38. The ions are accelerated towards the titanium cathodes 37 and 39 by the magnetic field B, such that titanium ions sputtered away from the cathode surface can hit and bind to the surface of the substrate 311 located in the first zone 312. The sublayer can be applied at a vacuum of about $5 \times 10^{-3}$ Pa up to $1 \times 10^{-4}$ Pa achieved by evacuating the chamber via port 35. The optimal thickness for the sublayer is around 0.01 microns thickness, however this can depend upon the application and the substrate being coated.

Once the sublayer is formed, the movable carrier 31 transfers the substrate 311 to be coated to a second zone of the chamber where the substrate 311 will act as a cathode. Here the vacuum chamber 6 includes a second anode 34 placed between the substrate 311 and a further cathode 310 whereby a uniform magnetic field B orthogonal to the surface of the substrate 311 is created due to the magnets located adjacent to the cathode 310 and substrate 311. The diamond like-coating is applied as described above for FIG. 1, with an etching gas introduced via an inlet 32, and then subsequently a hydrocarbon gas via an inlet 33. A hydrocarbon plasma is created at the second anode 34 and is directed towards the substrate 311 to be deposited on its surface to form a diamond-like coating.

While FIGS. 1 and 3 exemplify an embodiment in which the apparatus includes one anode and two cathodes for depositing the coating, in other embodiments the apparatus can have just one cathode, which is the substrate, and an anode, with the linear magnetic field formed between the cathode and anode.

Figure 4:
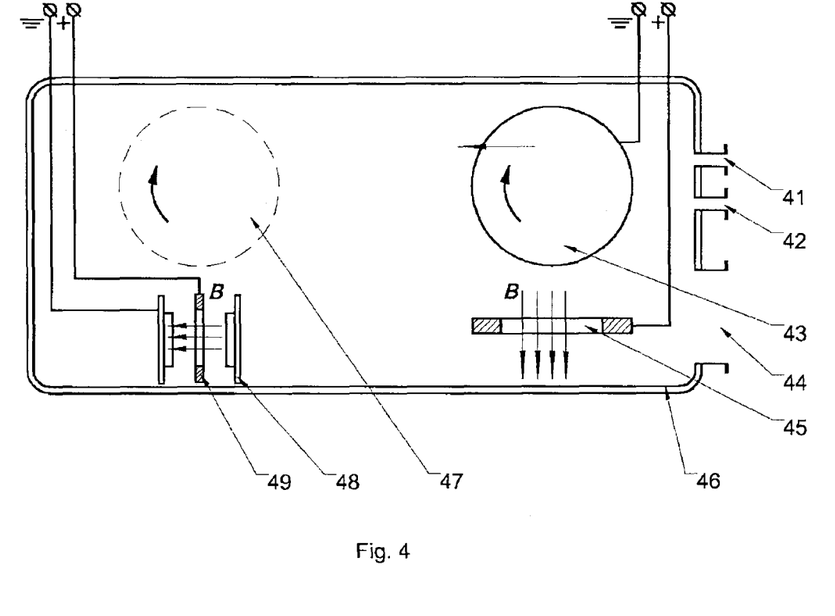
FIG. 4 shows a schematic view of an apparatus for applying a sublayer and a coating to the outer surface of a circular object.

Another embodiment of an apparatus for applying a sublayer and diamond-like coating to the outer surface of a substrate is shown in FIG. 4. A vacuum chamber 46 includes a sputter ion pump for sputtering a sublayer metal onto the outer surface of the substrate. The sputter ion pump includes two cathodes 48 and a first anode 49, with one of the cathodes being the metal for which the sublayer is to be made from. A magnetic field B is formed between the cathodes. The substrate to be coated 43 is located on a carrier and is initially positioned in a first zone 47 of the chamber. A plasma is created from a gas at the first anode 49 and the ions are accelerated towards to the cathodes such that the metal ions sputter away from the cathode surface and hit and bind to the surface of the substrate 43 located in the first zone 47. The substrate 43 is rotated as the sublayer is being applied to allow the whole outer surface of the object to be coated.

Once the sublayer is formed a movable carrier transfers the substrate 43 to a second zone of the chamber, where the substrate will act as a cathode. The vacuum chamber includes a second anode 45 and a magnetic source to produce a uniform magnetic field between the substrate 43 at the first zone and the anode 45, whose direction is substantially orthogonal to the surface to be coated. The diamond-like coating is applied as described above, wherein the chamber is evacuated via port 44, an etching gas is introduced via an inlet 41, and then subsequently a hydrocarbon gas is introduced via an inlet 42. A hydrocarbon plasma is created at the second anode 45 and is directed towards the substrate 43 in a linear manner such that the plasma is deposited on its surface. The substrate is rotated as the hydrocarbon plasma is deposited on the substrate surface so that a diamond-like coating is applied to the whole outer surface of the curved object.

FIGS. 3 and 4 demonstrate an embodiment in which the substrate is moved between the ion splutter pump and the second anode. In some embodiments the substrate is stationary and the sputter ion pump and second anode are movable. First a sputter ion pump arrangement is moved into position in the vacuum chamber to apply a sublayer to the substrate. Once the sublayer has been applied, the sputter ion pump arrangement is moved and the second anode is moved into place such that a uniform magnetic field whose direction is substantially orthogonal to the surface to be coated can be produced. The substrate acts as a cathode and a diamond-like coating is deposited onto the substrate.

Figure 5:
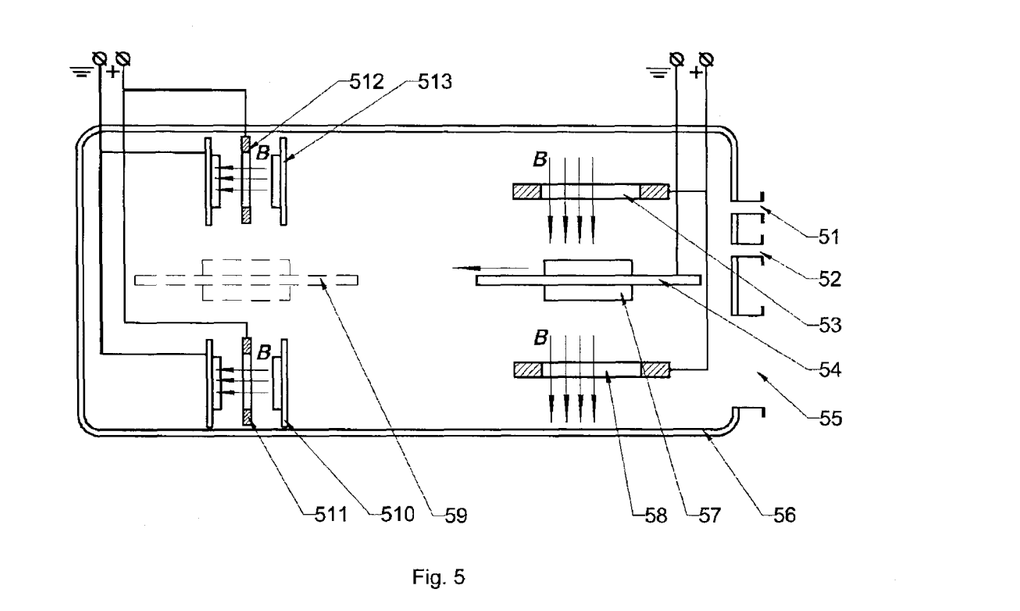
FIG. 5 shows a schematic view of an apparatus for applying a sublayer and a coating to two surfaces of a substrate.

FIG. 5 shows an embodiment of an apparatus for applying a sublayer and a diamond like coating to two surfaces of an object. A vacuum chamber 56 includes two anodes 53, 58 and a substrate 57 on a carrier 54. The substrate 57 acts as a cathode and is positioned in between the two anodes 53, 58, such the surfaces of the substrate to be coated are each facing an anode 53, 58. A magnetic source (not shown) produces a uniform magnetic field B between the anodes with the substrate to be coated in the middle. The diamond-like coating is deposited as described above. An etching gas is introduced to the chamber via an inlet 51, and then the hydrocarbon gas via an inlet port 52, the chamber also includes a port 55 for evacuation of the vacuum chamber. A hydrocarbon plasma is formed at each of the anodes 53, 58 and the magnetic field B maintains the hydrocarbon plasmas in the linear magnetic field as the plasma is directed towards each surface of the substrate 57 to be coated, thereby resulting in both surfaces of the substrate being coated simultaneously. A sublayer can be first applied to both surfaces of the substrate. This occurs by a similar arrangement as described in FIG. 3.

To coat two surfaces of the substrate, the vacuum chamber 56 includes two sputter ion pumps each having an anode 511, 512 and a pair of cathodes 510, 513, one of each of the pairs of cathodes being the metal from which the sublayer is to be made. The substrate 57 is located on a carrier 54 and is initially positioned in a first zone 59 of the chamber between the two sputter ion pumps. A magnetic field B is formed between each of the pairs of cathodes. A plasma is created from a gas in the chamber at each of the anodes 511, 152 forming the sputter ion pumps. The ions accelerate towards the cathodes, such that metal ions sputter away from the cathodes and towards the substrate surfaces upon which they can hit and bind. As there are two sputter ion pumps present in the chamber, both sides of the substrate can have a sublayer applied at the same time. Once the sublayer is applied, the movable carrier 54 transfers the substrate from the first zone to a second zone in the chamber where the substrate 57 will act as a cathode and is in between the two anodes for depositing a diamond-like coating on the surfaces of the substrate.

Figure 6:
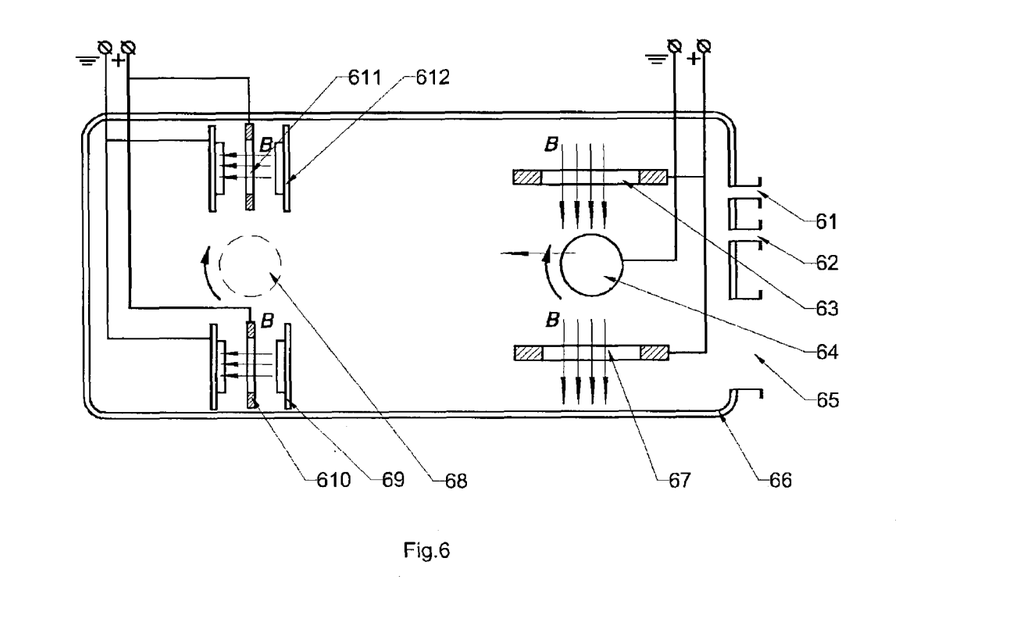
FIG. 6 shows a schematic view of an apparatus for applying a sublayer and coating to the outer surface of a circular object.

A similar arrangement can be used to apply a sublayer and a diamond-like coating to the outer surface of a circular object as shown in FIG. 6. A vacuum chamber 66 includes two sputter ion pump arrangements each having a pair of cathodes 69, 612 and a pair of anode 610, 611. A substrate 64 is initially located on a movable carrier in a first zone 68 of the chamber in between the two sputter ion pumps. A magnetic field B is formed between each of the pairs of cathodes. A plasma is created from a gas introduced into the chamber at each of the anodes 611, 610 forming the sputter ion pumps. The ions are accelerated towards the cathodes, such that metal ions sputter away from the cathode towards the surface of the substrate, upon which they can hit and bind. The substrate rotates as the sublayer is being applied.

Once the sublayer is applied, the movable carrier transfers the substrate 64 from the first zone to a second zone in the chamber where the substrate 64 will act as a cathode. The substrate is in between two anodes 63, 67 for depositing a diamond-like coating on the surfaces of the substrate. A magnetic source (not shown) produces a uniform magnetic field B between the anodes 63, 67 and the substrate 64. The diamond-like coating is deposited as described above. An etching gas is introduced to the chamber via an inlet 61 and then the hydrocarbon gas via is introduced via an inlet port 62. The chamber also includes a port 65 for evacuation of the vacuum chamber. A hydrocarbon plasma is formed at each of the anodes 63, 67 and is maintained within the magnetic field B as it is directed towards the surface of the substrate 64 to be coated, thereby resulting in two surface area of the substrate being coated simultaneously. As the diamond-like coating is being applied, the substrate will rotate so that the entire outer surface of the circular object will be coated.

Figure 7:
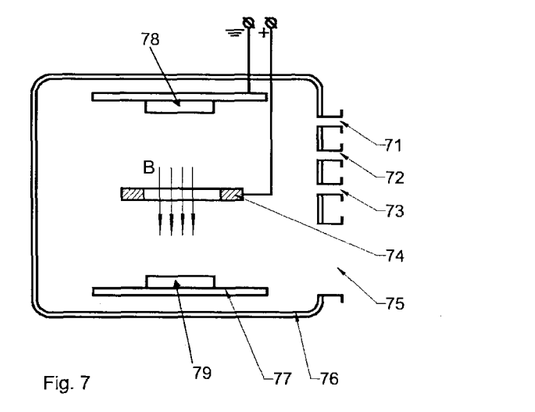
FIG. 7 shows a schematic view of an alternative apparatus for applying a sublayer to the substrate.

FIG. 7 shows another embodiment of an apparatus for applying a sublayer to a substrate 79 located on a carrier 77 before applying a diamond-like coating using a gas containing the sublayer material. The vacuum chamber 76 includes an inlet for the sublayer gas 71, an inlet for the hydrocarbon gas 73, an inlet for etching gas 72 and a port for evacuation of the vacuum chamber 75. The sublayer gas can contain aluminium, titanium or magnesium. In some embodiments, the sublayer gas contains titanium. The chamber 46 includes a cathode 78, an anode 74 and the substrate 79 which acts as a second cathode. The sublayer is applied by introducing the gas via the inlet 71 to the chamber 76. A plasma is formed at the anode 74 and the plasma is accelerated towards the substrate 79 in a uniform magnetic field B. This directly forms a sublayer on the substrate 79. The supply of the sublayer gas is stopped and the diamond-like coating is applied as described above using a hydrocarbon gas. A hydrocarbon gas is introduced into the chamber via its inlet 73. A hydrocarbon plasma is formed at the anode 74 and directed towards the substrate 79 while in a uniform magnetic field, directly depositing a diamond-like coating onto the substrate surface.

Temperature control is also important for good deposition of the coating. Temperature can be controlled by controlling the current which controls the heat generation. By configuring the apparatus so that heat is taken away from the substrate to be coated a higher rate of deposition at a higher current can be obtained.

An advantage of the present invention is that the process can be carried out at temperatures less than about 140° C. If the article to be coated has previously undergone hardness or heat treatment work, having to use higher temperature to apply the diamond-like coating could interfere with this previous work. This especially important when coating steel, where temperatures of 120-160° C. can be the start range for affecting the crystal structure of the metals. Most prior art methods are carried out at high temperatures above 200° C., but this can lead to internal stress and cracking of the coating particularly when the trying to increase the thickness of the coating. By carrying out the deposition at lower temperatures, the development of internal stress in the coatings is reduced. The apparatus of the invention is able to achieve thick coatings under 200° C., whereby previously only thin coatings have been achieved using temperatures below 200° C.

Using the apparatus and method of the invention for coating a substrate allows a coating thickness of greater than 50 microns, more particularly greater than 100 microns depending on the substrate, and a hardness of above 4000 HV. In contrast, coatings using previous methods typically do not obtain diamond-like coatings greater than about 2-5 microns as thicker coatings tend to disadhere from the surface. A co-efficient of friction of about 0.07-0.08 against dry steel or as low as 0.035 against itself at a high surface pressure (>3 GPa) can be obtained. The thicker coating enables an unusual, but valuable combination of high load bearing with low coefficient of friction.

Although the description exemplifies the apparatus for depositing a diamond-like coating the apparatus can be used to produce other coatings on a substrate, i.e. silicon based coatings such as silane.

Changes may be made while still remaining within the scope of the invention.

The invention claimed is:

1. An apparatus for depositing a coating onto a surface of a substrate comprising:
a vacuum chamber with an inlet for supplying a precursor gas to the chamber, the chamber comprising,
a carrier for locating the substrate in the chamber such that the substrate, when located in the carrier, constitutes a first cathode;
a first anode having an aperture in which a plasma can be formed,
a second cathode such that the anode is located between the first cathode and the second cathode, and
a magnetic field source configured to form a substantially linear magnetic field between the first and second cathodes, the magnetic field source comprising a first magnet and a second magnet, wherein the first cathode carries the first magnet and the second cathode carries the second magnet,
wherein when the substantially linear magnetic field between the first cathode and the second cathode is formed, the direction of the substantially linear magnetic field is substantially orthogonal to the surface to be coated and plasma production and deposition takes place substantially within the substantially linear magnetic field.

2. An apparatus according to claim 1, wherein the anode has a non-circular aperture.

3. An apparatus according to claim 1, wherein the anode has an aperture with a depth:width aspect ratio greater than 1:2.

4. An apparatus according to claim 1 comprising an unpulsed DC bias voltage supply.

5. An apparatus according to claim 1 wherein the magnets are permanent magnets.

6. An apparatus according to claim 1, wherein the chamber comprises a first zone having a sputter ion pump for the deposition of a sublayer on the substrate, and a second zone for deposition of the coating, wherein the carrier is movable between the first zone and the second zone.

7. An apparatus according to claim 1 wherein the chamber further comprises an inlet for introducing a sublayer gas into the chamber.

8. An apparatus according to claim 1 comprising a second anode located on the opposite side of the substrate from the first anode for depositing a coating onto at least two opposite surfaces of a substrate wherein a plasma is produced at each of the anodes.

9. A method for depositing a coating onto a surface of a substrate in a vacuum chamber comprising an inlet for supplying a precursor gas to the chamber, the chamber comprising a carrier for locating the substrate in the chamber, the method comprising:
locating the substrate in the carrier, wherein the carrier locates the substrate in the chamber such that, when located in the carrier, the substrate constitutes a first cathode;
creating, using a magnetic field source, a substantially linear magnetic field between the first cathode and a second cathode, wherein the second cathode is disposed within the chamber such that a first anode, having an aperture in which a plasma can be formed, is located between the first cathode and the second cathode, wherein the magnetic field is substantially orthogonal to the surface of the substrate and wherein the magnetic field source comprises a first magnet and a second magnet, wherein the first cathode carries the first magnet and the second cathode carries the second magnet;
supplying the precursor gas into the chamber;
creating a plasma from the gas within the substantially linear magnetic field, at the aperture of the first anode;
controlling the plasma within the substantially linear magnetic field; and
depositing a coating onto the substrate substantially within the substantially linear magnetic field.

10. A method according to claim 9, wherein the first anode has non-circular aperture.

11. A method according to claim 9 wherein the first anode has an aperture with a depth:width aspect ratio greater than 1:2.

12. A method according to claim 9 comprising supplying a hydrocarbon gas as the precursor gas.

13. A method according to claim 9 wherein the process is carried out at a temperature of less than 200° C.

14. A method according to claim 9 comprising applying an unpulsed DC bias voltage to create the plasma.

15. A method according to claim 9 comprising rotating the substrate relative to the first anode to coat the surface of the substrate.

16. A method according to claim 9 comprising depositing a sublayer on the surface of the substrate in a first zone of the chamber using a sputter ion pump and depositing the coating onto the substrate in a second zone of the chamber.

17. A method according to claim 16, further comprising introducing a gas containing the sublayer material into the chamber, which will form a plasma and deposit a sublayer directly onto the surface of the substrate, before introducing the precursor gas into the chamber to deposit the coating.

18. A method according to claim 9 comprising placing the first anode inside the substrate to be coated to deposit a coating onto an inner surface of the substrate.

* * * * *